(12) United States Patent
Huot et al.

(10) Patent No.: US 10,325,749 B2
(45) Date of Patent: Jun. 18, 2019

(54) PROCESS FOR REPAIRING AN ANODE FOR EMITTING X-RAYS AND REPAIRED ANODE

(71) Applicant: ACERDE, Sainte Helene Du Lac (FR)

(72) Inventors: Guillaume Huot, Chambery (FR); Ariane Petitjean, Barraux (FR); Herve Poirel, Sant Martin D'uriage (FR); Pierre-Olivier Robert, La Ravoire (FR)

(73) Assignee: ACERDE, Sainte Helene Du (FR)

( * ) Notice: Subject to any disclaimer, the term of this patent is extended or adjusted under 35 U.S.C. 154(b) by 275 days.

(21) Appl. No.: 14/636,230

(22) Filed: Mar. 3, 2015

(65) Prior Publication Data
US 2015/0248988 A1    Sep. 3, 2015

(30) Foreign Application Priority Data

Mar. 3, 2014 (FR) ..................... 14 51695

(51) Int. Cl.
| | |
|---|---|
| *H01J 9/50* | (2006.01) |
| *C23C 16/02* | (2006.01) |
| *C23C 16/06* | (2006.01) |
| *C23C 16/56* | (2006.01) |
| *H01J 35/10* | (2006.01) |
| *C23C 10/02* | (2006.01) |
| *C23C 10/28* | (2006.01) |

(52) U.S. Cl.
CPC ............ *H01J 9/50* (2013.01); *C23C 10/02* (2013.01); *C23C 10/28* (2013.01);
(Continued)

(58) Field of Classification Search
CPC ..... C23C 10/02; C23C 10/28; C23C 16/0254; C23C 16/0281; C23C 16/06; C23C 16/56;
(Continued)

(56) References Cited

U.S. PATENT DOCUMENTS

| | | | | |
|---|---|---|---|---|
| 3,637,374 A | * | 1/1972 | Holzi | .................. C22C 1/00 |
| | | | | 164/46 |
| 4,700,882 A | | 10/1987 | Devine, Jr. | |

(Continued)

FOREIGN PATENT DOCUMENTS

| | | |
|---|---|---|
| EP | 0062380 A1 | 10/1982 |
| WO | WO-2006117145 A2 | 11/2006 |
| WO | WO-2009019645 A2 | 2/2009 |

OTHER PUBLICATIONS

Hua, Zhang, Du, Huang. Inter-diffusion analysis of joint interface of tungsten-rhenium couple. Journal of Nuclar Materials 416(2011) p. 270-272.*

(Continued)

*Primary Examiner* — Dah-Wei D. Yuan
*Assistant Examiner* — Jose Hernandez-Diaz
(74) *Attorney, Agent, or Firm* — Crowe & Dunlevy

(57) ABSTRACT

A process for repairing a damaged annular region of an anode configured to emit x-rays includes the step of machining the damaged annular region made of an initial target coating to a depth smaller than a thickness of the coating so as to leave behind a residual annular layer. An intermediate layer is then deposited on the residual annular layer. A repairing layer is then deposited on the intermediate layer. A heat treatment is then performed using an anneal which causes, by interdiffusion and formation of a solid solution, the material of the intermediate layer and the material of the residual annular layer to diffuse into each other and further cause the material of the intermediate layer and the material of the repairing layer diffuse into each other. As a result of this anneal the intermediate layer disappears.

18 Claims, 2 Drawing Sheets

(52) U.S. Cl.
CPC ...... *C23C 16/0254* (2013.01); *C23C 16/0281* (2013.01); *C23C 16/06* (2013.01); *C23C 16/56* (2013.01); *H01J 35/108* (2013.01); *H01J 2235/085* (2013.01); *H01J 2235/088* (2013.01); *Y02W 30/828* (2015.05)

(58) Field of Classification Search
CPC .. H01J 2235/085; H01J 2235/088; H01J 9/50; H01J 35/108
See application file for complete search history.

(56) References Cited

U.S. PATENT DOCUMENTS

| | | |
|---|---|---|
| 5,013,274 A | 5/1991 | Bargues et al. |
| 8,428,222 B2 | 4/2013 | Steinlage et al. |
| 2009/0086919 A1 | 4/2009 | Steinlage et al. |
| 2010/0092699 A1* | 4/2010 | Steinlage ............ H01J 35/08 427/591 |
| 2011/0007872 A1 | 1/2011 | Steinlage et al. |
| 2011/0211676 A1 | 9/2011 | Dorscheid et al. |

OTHER PUBLICATIONS

Dunkerton. Diffusion bonding—an overview. The Welding Institute (1991). Retrieved from https://link.springer.com/content/ pdf/10.1007/978-94-011-3674-7_1.pd.*

EPO Search Report and Written Opinion for co-pending EP Appl. No. 15156644.5 dated Jun. 30, 2015 (7 pages).

INPI Search Report and Written Opinion for FR 1451695 dated Dec. 19, 2014 (8 pages).

* cited by examiner

PROCESS FOR REPAIRING AN ANODE FOR EMITTING X-RAYS AND REPAIRED ANODE

PRIORITY CLAIM

This application claims priority from French Application for Patent No. 1451695 filed Mar. 3, 2014, the disclosure of which is incorporated by reference.

TECHNICAL FIELD

The present invention relates to the field of x-ray emitter devices, especially those used to produce images, and more particularly those used in medical imaging scanners.

BACKGROUND

X-rays are produced by a refractory material, generally tungsten or an alloy made up mainly of tungsten, under the effect of an incident beam of electrons that is directed towards and bombards locally said material.

Commonly, the refractory material takes the form of a target coating formed on a disc made of another material and extending over an annular zone of the disc, this assembly being called an anode. This anode is mounted on a rotated shaft, such that the incident beam of electrons sweeps an annular track across the annular target coating made of a refractory material.

Generally, the speeds of rotation of such anodes may reach about 10,000 rotations per minute. The temperature at the point of impact of the electrons may reach 2000° C., the temperature of the anode, in its bulk, generally stabilizing at about 1300° C.

Such operation generates high thermomechanical stresses that gradually degrade the target coating made of a refractory material, more particularly in the scanned annular zone or track, possibly consisting in enlargement of the grains of the refractory material, in the appearance of microcracks and/or in erosion of the refractory material. Such degradation leads to a degradation of the power of the x-rays and to an increase in the spatial dispersion of the x-rays.

On account of the cost of the materials forming the disc, generally a molybdenum/titanium/zirconium (TZM) alloy, a graphite or a carbon/carbon composite, and the cost of manufacturing such a disc, it would seem to be desirable to repair damaged anodes. To this end, a number of solutions have already been proposed.

U.S. Pat. No. 5,013,274 (incorporated by reference) describes a method for repairing anodes, in which holes resulting from damage to the target coating made of a refractory material are located, these holes are filled by local deposition of the refractory material, using a vapor phase deposition technique, followed by a sinter, and a machining or grinding operation is carried out in order to remove material deposited in excess relative to the rest of the surface of the initial target coating.

United States Patent Application Publication No. 2011/0211676 (incorporated by reference) describes a method for repairing anodes, in which damaged sections of the target coating are removed, refractory material is deposited in the form of a powder, and this powder is sintered and a machining or grinding operation is carried out in order to remove excess deposited material.

The methods described in the above documents are not entirely satisfactory because the repaired sections are fragile.

U.S. Pat. No. 8,428,222 and United States Patent Application Publication No. 2011/0007872 (both incorporated by reference) describe a method for repairing anodes in which an annular portion of the disc, which portion is equipped with a target coating made of a refractory material, is removed and replaced by a new portion equipped with a new target coating, this new portion being brazed, soldered or welded to the disc.

This method requires the disc to be worked and positioning the added new portion poses problems.

The aim of the present invention is to improve considerably the properties of repaired anodes.

SUMMARY

A process is provided for repairing an anode for emitting x-rays, comprising a disc equipped, on an annular zone, with an initial target coating comprising at least one material able to produce x-rays under the effect of an incident beam of electrons.

This process comprises: a step of machining at least one annular portion of said initial target coating to a depth smaller than its thickness so as to leave behind a residual annular layer of this annular portion; a step of depositing an intermediate layer on said residual annular layer; a step of depositing a repairing layer on said intermediate layer; and a heat treatment step in which an anneal is carried out such that, by interdiffusion and formation of a solid solution, the material of said intermediate part and the material of said residual annular part diffuse into each other and the material of the intermediate layer and the material of the repairing layer diffuse into each other, until said intermediate layer disappears.

The process may comprise a step of preparing the roughness and/or of deoxidizing the surface of said residual annular layer.

The process may comprise a step of machining and/or grinding the surface of the repairing layer.

Depending on the process, the material of the initial layer and the material of the repairing layer may comprise tungsten or an alloy made up mainly of tungsten.

Depending on the process, the material of the intermediate layer may comprise rhenium or an alloy made up mainly of rhenium.

Depending on the process, the intermediate layer and the repairing layer may be produced by chemical vapor deposition (CVD).

Depending on the process, the annealing heat treatment may be carried out at a temperature comprised between 1200° C. and 2000° C., for a length of time comprised between one hour and eight hours.

An anode for emitting x-rays is also provided, comprising a disc equipped, on an annular zone, with a target coating able to produce x-rays under the effect of an incident beam of electrons, in which said target coating, exempt of internal interfaces, comprises, in at least one annular portion, an internal layer covered with an external layer, there being, between these layers, a diffuse transition zone in which an intermediate material is diffused into the material of said internal layer and into the material of said external layer in the form of a solid solution.

The material of the internal layer and the material of the external layer may comprise tungsten or an alloy made up mainly of tungsten.

Said intermediate material may comprise rhenium or an alloy made up mainly of rhenium.

BRIEF DESCRIPTION OF THE DRAWINGS

An anode for emitting x-rays and steps for repairing this anode will now be described by way of non-limiting examples that are illustrated by the drawings, in which.

DETAILED DESCRIPTION OF THE DRAWINGS

Figure 1:
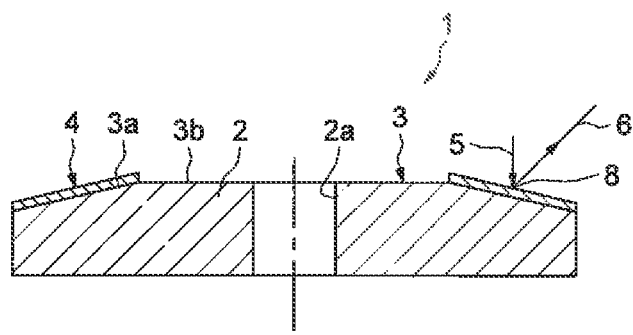
FIG. 1 shows a cross section through a rotary anode bearing a target coating.

An anode 1 for producing x-rays, illustrated in FIG. 1, comprises a substrate consisting of a rotary disc 2 that has a central mounting through-passage 2a, able to receive one end of a rotated shaft (not shown), and that has a frontal face 3 that has a slightly frustoconical annular zone 3a located around a radial central zone 3b through which the passage 2a passes.

The rotary disc 2 may be integrally formed and made of a molybdenum/titanium/zirconium (TZM) alloy, of graphite or of a carbon/carbon composite, or may be made of a number of annular parts comprising these materials.

In the annular zone 3a of the frontal face 3, a target coating 4 is present. This coating 4 may extend as far as the peripheral edge of the frontal face 3 and may optionally extend over the peripheral face of the disc 2. The coating 4 may be produced at the same time as the disc 2, or may be added to a disc manufactured beforehand. Furthermore, the coating 4 may comprise one or more layers.

The coating 4 comprises at least one material able to produce x-rays in a direction 6, under the effect of a beam of electrons incident in a direction 5, and directed towards and locally bombarding the material. When the disc 2 rotates, the point of impact of the incident beam of electrons describes an annular local track 8 across the coating.

The coating 4 may comprise a layer, for example of tungsten, or an alloy mainly comprising tungsten, for example tungsten/rhenium, formed by sintering or deposited by chemical vapor deposition (CVD). The thickness of the coating 4 may be comprised between two hundred and three thousand microns.

Figure 2:
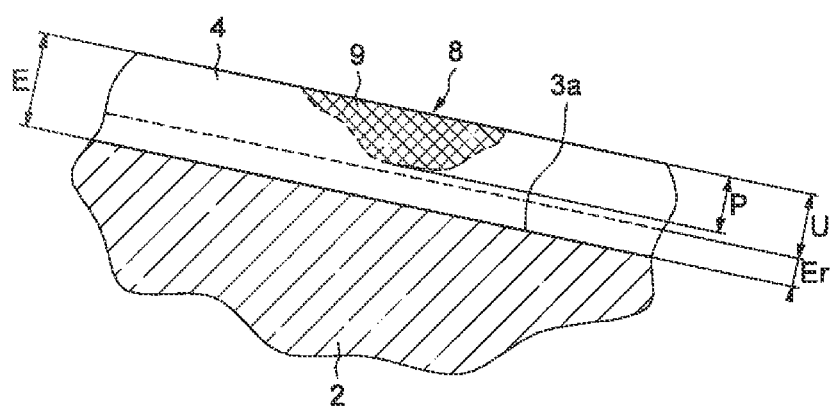
FIG. 2 shows an enlarged partial cross section through a coating of the anode in FIG. 1.

As illustrated in FIG. 2, in operation, the track 8 of the coating 4 of the anode 1 is subjected to high thermomechanical stresses. These stresses cause degradation 9 of the material, starting from the surface of the coating 4, especially taking the form of microcracks, melting, an increase in roughness, modification of the grains of the material, and/or of an annular trough resulting from material removal. This degradation 9 leads to a decrease in the capacity of the anode 1 to produce x-rays, such that said anode 1 is no longer usable.

A process allowing the anode 1 thus degraded to be repaired will now be described.

Firstly, the depth of the degradation 9 is measured. To do this, interferometric optical measuring techniques or ultrasonic measuring techniques known per se may be used.

In order for the anode 1 to be repairable, the depth P of the degradation 9 should be smaller than the thickness E of the coating 4.

Next, partial machining of the coating 4 is carried out to a depth U at least equal to the depth P, but smaller than the thickness E of the coating 4, such that a residual thickness Er of the coating 4 remains on the disc 2. This machining may be carried out using a cylindrical grinder.

Figure 3:
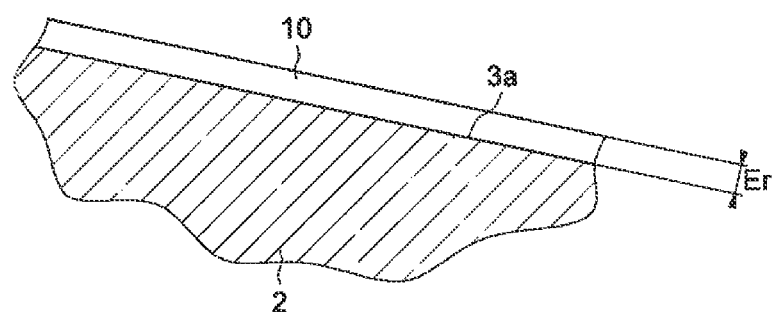
FIG. 3 shows an enlarged partial cross section through the coating of the anode in FIG. 2, in one repairing step.

As illustrated in FIG. 3, the disc 1 is then equipped with a residual annular layer 10 corresponding to the residual thickness Er of the initial coating 4. The residual thickness Er may be comprised between one hundred and two thousand five hundred microns.

Next, if the roughness of the surface of the residual layer 10 resulting from the above machining is not satisfactory or too irregular, it may be prepared by carrying out a mechanical surface treatment such as sandblasting, bead blasting or cryogenic cleaning (spraying of solid $CO_2$ for example). The preferable roughness may be comprised between half a micron and five microns.

Next, the surface of the residual layer 10 may be chemically cleaned in order to remove oxides, with an external chemical etch or in a reactor with a flow of a gas.

Figure 4:
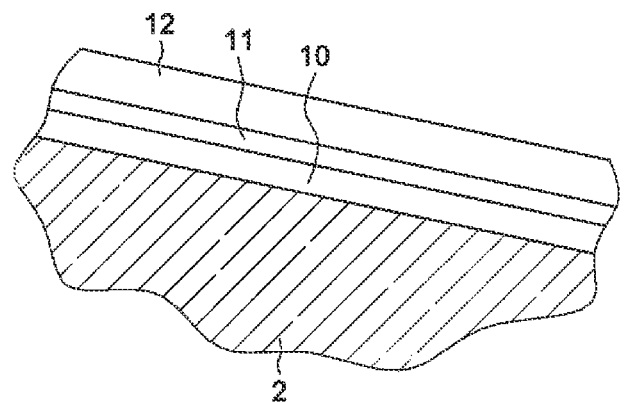
FIG. 4 shows an enlarged partial cross section through the coating of the anode in FIG. 2, in another repairing step.

Next, as illustrated in FIG. 4, an intermediate annular tie layer 11 is deposited on the residual layer 10, then an annular repairing layer 12 is deposited on the intermediate layer 11.

The material from which the intermediate tie layer 11 is made may be chosen from rhenium, tantalum, zirconium, niobium, titanium, vanadium, hafnium or an alloy of these materials.

The repairing layer 12 may be made of a material identical or equivalent to the material from which the initial coating 4 is made, for example of tungsten or an alloy mainly comprising tungsten, for example tungsten/rhenium.

The layers 11 and 12 may be deposited by chemical vapor deposition (CVD), known per se.

The thickness of the intermediate layer 11 may be comprised between fifty nanometers and ten microns and the thickness of the repairing layer 12 may be comprised between one hundred and one thousand microns.

Next, an annealing heat treatment is applied such that, by interdiffusion and formation of a solid solution, the material of the intermediate layer 11 part and the material of the residual layer 10 part diffuse into each other, and the material of the intermediate layer 11 and the material of the repairing layer 12 diffuse into each other, until the prior intermediate layer 11 and prior internal interfaces between the prior intermediate layer 11 and the prior layers 10 and 12 disappear.

Figure 5:
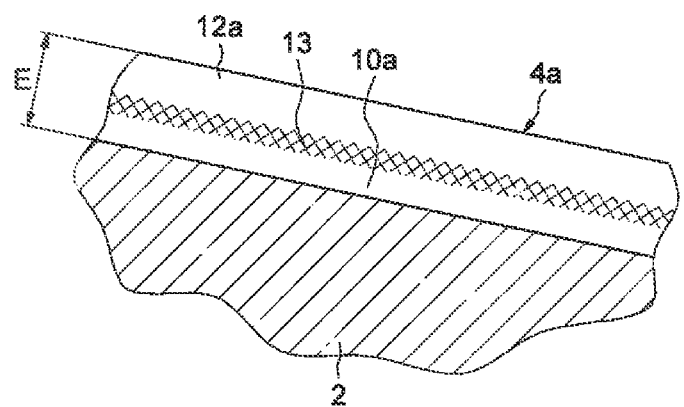
FIG. 5 shows an enlarged partial cross section through the coating of the anode in FIG. 2, in another repairing step.

As illustrated in FIG. 5, the new target coating 4a, exempt of internal interfaces, then comprises an internal layer 10a substantially corresponding to the residual internal layer 10 and an external layer 12a substantially corresponding to the external repairing layer 12 and comprises a diffuse transition zone 13 between these layers 10a and 12a, in which zone the material that made up the intermediate layer 11 beforehand is diffused into the material of the residual layer 10 and into the material of the repairing layer 12 in the form of a solid solution.

According to one particular example, the atoms of the rhenium that possibly made up the intermediate layer 11 beforehand have migrated on the one hand into the residual layer 10 made of tungsten or tungsten/rhenium and on the other hand into the repairing layer 12 made of tungsten or tungsten/rhenium, such that the actual rhenium intermediate layer 11 present beforehand has disappeared.

The annealing heat treatment may be carried out at a temperature comprised between 1200° C. and 2000° C., for a length of time of a few hours, for example for a length of time comprised between one hour and eight hours, depending on the various thicknesses to be treated.

The new coating 4a is preferably thicker than the initial coating 4. The surface of the new coating 4a may then be machined or ground down such that its thickness equals or is as close as possible to the thickness of the initial coating 4.

Thus, the repaired anode 1 is in accordance with the previously damaged anode 1 and may be reused directly.

As a result of the above, the diffuse transition zone 13 of the new coating 4a forms a robust joint between the internal layer 10a and the external layer 12a, especially by virtue of the removal by diffusion of the prior intermediate layer 11, and therefore of the removal of the fragile interfaces that existed beforehand between this prior intermediate layer 11 and these internal and external layers 10 and 12, and of the direct adhesion between these layers 10a and 12a, resulting from the annealing heat treatment. In addition, this diffuse transition zone 13 ensures the internal layer 10a and the external layer 12a make good thermal contact.

The repairing process described above was applied to the entire area of the initial annular coating 4. Nevertheless, according to one variant embodiment, the repairing process could be applied to an annular portion of the initial annular coating 4 including the damaged annular portion 9 corresponding to the annular track 8.

The present invention is not limited to the examples described above. Other variant embodiments are possible without departing from the scope of the invention.

The invention claimed is:

1. A process for repairing an anode for emitting x-rays, comprising a disc equipped, on an annular zone, with an initial damaged target coating layer comprising at least one material able to produce x-rays under the effect of an incident beam of electrons, comprising:
   machining at least one annular portion of said initial damaged target coating layer to a depth smaller than its thickness so as to leave behind a residual annular target coating layer on said disc;
   chemical vapor depositing an intermediate layer on said residual annular target coating layer;
   chemical vapor depositing a repairing layer on said intermediate layer; and
   heat treating using an anneal carried out such that, by interdiffusion and formation of a solid solution, the material of said intermediate layer and the material of said residual annular target coating layer diffuse into each other and the material of the intermediate layer and the material of the repairing layer diffuse into each other, until said intermediate layer disappears to form a diffuse transition zone between an internal layer substantially corresponding to the residual annular target coating layer and an external layer substantially corresponding to the repairing layer.

2. The process according to claim 1, further comprising preparing a surface of said residual annular target coating layer prior to chemical vapor depositing the intermediate layer, wherein preparing comprises performing at least one of roughing the surface and deoxidizing the surface.

3. The process according to claim 1, further comprising performing at least one of machining and grinding a surface of the external layer.

4. The process according to claim 1, wherein the material of the initial damaged target coating layer and the material of the repairing layer comprise tungsten or an alloy made up mainly of tungsten.

5. The process according to claim 4, wherein the material of the intermediate layer comprises rhenium or an alloy made up mainly of rhenium.

6. The process according to claim 1, wherein heat treating comprises performing an annealing heat treatment carried out at a temperature comprised between 1200° C. and 2000° C. for a length of time comprised between one hour and eight hours.

7. A process for repairing an anode for emitting x-rays, comprising a disc equipped, on an annular zone, with an initial damaged target coating layer comprising at least one material able to produce x-rays under the effect of an incident beam of electrons, comprising:
   machining at least one annular portion of said initial damaged target coating layer to a depth smaller than its thickness so as to leave behind a residual annular target coating layer on said disc;
   chemical vapor depositing an intermediate layer on said residual annular target coating layer;
   chemical vapor depositing a repairing layer on said intermediate layer; and
   heat treating using an anneal to form, by interdiffusion and formation of a solid solution until said intermediate layer disappears, a diffuse transition zone between a non-diffused thickness of said residual annular target coating layer and a non-diffused thickness of the repairing layer.

8. The process according to claim 7, further comprising preparing a surface of said residual annular target coating layer prior to chemical vapor depositing the intermediate layer, wherein preparing comprises performing at least one of roughing the surface and deoxidizing the surface.

9. The process according to claim 7, further comprising performing at least one of machining and grinding a surface of the repairing layer after said heating treating.

10. The process according to claim 7, wherein the material of the initial damaged target coating layer and the material of the repairing layer comprise tungsten or an alloy made up mainly of tungsten.

11. The process according to claim 10, wherein the material of the intermediate layer comprises rhenium or an alloy made up mainly of rhenium.

12. The process according to claim 7, wherein heat treating comprises performing an annealing heat treatment carried out at a temperature comprised between 1200° C. and 2000° C. for a length of time comprised between one hour and eight hours.

13. A process for repairing a damaged anode target layer on an anode comprising a disc equipped, on an annular zone, with the damaged anode target layer, wherein the damaged anode target layer is configured to produce x-rays under the effect of an incident beam of electrons, comprising:
   machining a portion of said damaged anode target layer to a depth smaller than its thickness so as to leave behind a residual anode target portion;
   chemical vapor depositing an intermediate layer on said residual anode target portion;
   chemical vapor depositing a repairing layer on said intermediate layer; and
   heat treating using an anneal to form, by interdiffusion and formation of a solid solution until said intermediate layer disappears, a diffuse transition zone between a non-diffused thickness of said residual anode target portion and a non-diffused thickness of the repairing layer.

14. The process according to claim 13, further comprising preparing a surface of said residual anode target portion prior to chemical vapor depositing the intermediate layer, wherein preparing comprises performing at least one of surface roughing and surface deoxidizing.

15. The process according to claim 13, further comprising performing at least one of machining and grinding a surface of the repairing layer after said heat treating.

16. The process according to claim 13, wherein the material of the damaged anode target layer and the material of the repairing layer comprise tungsten or an alloy made up mainly of tungsten.

17. The process according to claim 16, wherein the material of the intermediate layer comprises rhenium or an alloy made up mainly of rhenium.

18. The process according to claim 13, wherein heat treating comprises performing an annealing heat treatment carried out at a temperature comprised between 1200° C. and 2000° C. for a length of time comprised between one hour and eight hours.

* * * * *